US009841477B2

(12) United States Patent
Kozlov et al.

(10) Patent No.: US 9,841,477 B2
(45) Date of Patent: Dec. 12, 2017

(54) METHOD FOR MULTI-MODE, MULTI-LOAD, AND MULTI-DOMAIN OPTIMIZATION OF A MULTI-CHANNEL NEAR-FIELD RF TRANSMITTER

(75) Inventors: Mikhail Kozlov, Dresden (DE); Robert Turner, Leipzig (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 615 days.

(21) Appl. No.: 14/384,974

(22) PCT Filed: Mar. 14, 2012

(86) PCT No.: PCT/EP2012/001144
§ 371 (c)(1),
(2), (4) Date: Sep. 12, 2014

(87) PCT Pub. No.: WO2013/135251
PCT Pub. Date: Sep. 19, 2013

(65) Prior Publication Data
US 2015/0028869 A1    Jan. 29, 2015

(51) Int. Cl.
*G01R 33/54* (2006.01)
*G01R 33/561* (2006.01)
*G01R 33/36* (2006.01)

(52) U.S. Cl.
CPC ......... *G01R 33/54* (2013.01); *G01R 33/3607* (2013.01); *G01R 33/5612* (2013.01)

(58) Field of Classification Search
CPC . G01R 33/54; G01R 33/3607; G01R 33/5612
See application file for complete search history.

(56) References Cited

U.S. PATENT DOCUMENTS 4,129,822 A    12/1978   Traficante
4,320,342 A     3/1982   Heinzerling
(Continued)

FOREIGN PATENT DOCUMENTS

WO    WO2010110881    9/2010
WO    WO2011029452    3/2011

OTHER PUBLICATIONS

International Search Report for corresponding PCT Application No. PCT/EP2012/001144 dated Aug. 7, 2012.
(Continued)

*Primary Examiner* — Gregory H Curran
(74) *Attorney, Agent, or Firm* — Caesar Rivise, PC

(57) ABSTRACT

The invention relates to a method for optimization of a performance of a multi-channel transmitter including several transmit elements, particularly in a magnetic resonance imaging device. The method includes: (a) Exciting the transmit elements of the multi-channel transmitter by electric excitation signals comprising a specific power, with the power of the excitation signals partially reflected by the transmit elements of the multichannel transmitter, (b) Determining a reflected power which is reflected by the multi-channel transmitter during excitation of the transmit elements, (c) Determining reflection coefficients $S_{xx}$ of the multi-channel transmitter, (d) Determining reflection coefficients $S_{xy}$ of the multi-channel transmitter, (e) Calculating a performance criterion representing the performance of the multi-channel transmitter, with the performance criterion based on the reflected power, the reflection coefficients $S_{xx}$ and the reflection coefficients $S_{xy}$, and (f) Tuning the multi-channel transmitter so that the performance criterion is optimized.

18 Claims, 8 Drawing Sheets

(56) References Cited

U.S. PATENT DOCUMENTS

| | | |
|---|---|---|
| 4,638,253 A | 1/1987 | Jaskolski et al. |
| 4,721,915 A | 1/1988 | Kestler |
| 4,725,780 A | 2/1988 | Yoda et al. |
| 4,731,584 A | 3/1988 | Misic et al. |
| 4,737,718 A | 4/1988 | Kemner et al. |
| 4,751,464 A | 6/1988 | Bridges |
| 4,752,736 A | 6/1988 | Arakawa et al. |
| 4,780,677 A | 10/1988 | Nissenson et al. |
| 4,783,641 A | 11/1988 | Hayes et al. |
| 4,788,503 A | 11/1988 | Van Heelsbergen |
| 4,820,985 A | 4/1989 | Eash |
| 4,871,969 A | 10/1989 | Roemer et al. |
| 4,879,516 A | 11/1989 | Mehdizadeh et al. |
| 4,885,539 A | 12/1989 | Roemer et al. |
| 4,918,388 A | 4/1990 | Mehdizadeh et al. |
| 4,926,125 A | 5/1990 | Roemer |
| 5,081,418 A | 1/1992 | Hayes et al. |
| 5,159,929 A | 11/1992 | Morris et al. |
| 5,172,061 A | 12/1992 | Crooks et al. |
| 5,185,575 A | 2/1993 | Overweg |
| 5,196,797 A | 3/1993 | Tropp |
| 5,243,286 A | 9/1993 | Rzedzian et al. |
| 5,365,173 A | 11/1994 | Zou et al. |
| 5,461,314 A | 10/1995 | Arakawa et al. |
| 5,473,252 A | 12/1995 | Renz et al. |
| 5,483,158 A | 1/1996 | van Heteren et al. |
| 5,483,163 A | 1/1996 | Wen et al. |
| 5,565,779 A | 10/1996 | Arakawa et al. |
| 5,610,521 A | 3/1997 | Zou et al. |
| 5,642,048 A | 6/1997 | Crozier et al. |
| 5,791,648 A | 8/1998 | Hohl |
| 5,998,999 A | 12/1999 | Richard et al. |
| 6,011,395 A | 1/2000 | Leifer et al. |
| 6,107,798 A | 8/2000 | Hoult |
| 6,538,442 B2 | 3/2003 | Boskamp |
| 6,552,544 B2 | 4/2003 | Wong et al. |
| 6,771,070 B2 | 8/2004 | Lee |
| 6,853,193 B2 | 2/2005 | Riederer et al. |
| 6,940,466 B2 | 9/2005 | Terry |
| 6,975,114 B1 | 12/2005 | Ledden |
| 7,012,429 B1 | 3/2006 | Ledden |
| 7,088,100 B2 | 8/2006 | Boskamp et al. |
| 7,088,104 B2 | 8/2006 | Bottomley |
| 7,173,425 B2 | 2/2007 | Boskamp et al. |
| 7,285,957 B2 | 10/2007 | Boskamp et al. |
| 7,298,145 B2 | 11/2007 | Neufeld et al. |
| 7,345,485 B2 | 3/2008 | Jevtic et al. |
| 7,358,923 B2 | 4/2008 | Terry |
| 7,501,823 B2 | 3/2009 | Nistler et al. |
| 7,573,270 B2 | 8/2009 | Neufeld et al. |
| 7,642,782 B2 * | 1/2010 | Vernickel ............. G01R 33/365 324/318 |
| 8,729,895 B2 * | 5/2014 | Freytag ............. G01R 33/3614 324/307 |

OTHER PUBLICATIONS

Adriany, et al., "Experimental Verification of Enhanced B1 Shim Performance With a Z-Encoding RF Coil Array at 7 Tesla", Proceedings of the 18th Annual Meeting, May 2010, p. 3831.

Brunner et al., "A Comparison of Matching Strategies for RF Transmission Arrays Based on Network Theory", Proc. Intl. Soc. Mag. Reson. Med., Jan. 1, 2008, p. 143.

Collins et al., "Strengths and Limitations of Pulsing Coils in an Array Sequentially to Avoid RF Interference in High Field MRI", Proc. Intl. Soc. Mag. Reson., Jan. 1, 2005, p. 816.

Gilbert et al., "A Radiofrequency Coil to Facilitate B1 Shimming and Parallel Imaging Acceleration in Three Dimensions at 7 T," NMR Biomed, vol. 24, 2010, pp. 815-823.

Kim et al., "Improved B1+ Field Using a 16-Channel Transmit Head Array and an 8-Channel pTx System at 7T," Proc. Intl. Soc. Mag. Reson. Med., 2011, p. 3829.

Kozlov et al., "Analysis of Transmit Magnetic Field Homogeneity for a 7T Multi-channel MRI Loop Array" Progress in Electromagnetics Research Symposium Proceedings, Marrakesh, Morocco, Mar. 2011, pp. 1607-1611.

Kozlov et al., "Analysis of RF transmit Performance for a Multi-Row Multi-Channel MRI Loop Array at 300 and 400 MHz", Proceedings of the Asia-Pacific Microwave Conference 2011, pp. 1190-1193.

Kozlov et al., "Analysis of RF Transmit Performance for a 7T Dual Row Multi-Channel MRI Loop Array," Proceedings of 33rd Annual International Conference of the IEEE EMBS, 2011, pp. 547-553.

Kozlov et al, "Analysis of Transmit Performance Optimization Strategies for Multi Channel MRI Array", Piers Proceedings, 2011, pp. 1622-1626.

Kozlov et al., "Influence of Loop Array Geometry on Near Field Transmit Properties at 300 MHz", Proceedings of 2011 IEEE International Symposium on Antennas and Propagation, Jul. 2011, pp. 1715-1718.

Kozlov et al., "Performance Optimization of a Multi-Channel Transmit Coil With Significant Coupling Between Elements", Proc. Intl. Soc. Mag. Reson. Med., 2009, p. 4765.

\* cited by examiner

METHOD FOR MULTI-MODE, MULTI-LOAD, AND MULTI-DOMAIN OPTIMIZATION OF A MULTI-CHANNEL NEAR-FIELD RF TRANSMITTER

CROSS-REFERENCE TO RELATED APPLICATIONS

This national stage application claims the benefit under 35 U.S.C. §371 of International Application No. PCT/EP2012/001144 filed on Mar. 14, 2012, entitled A METHOD FOR MULTI-MODE, MULTI-LOAD, AND MULTI-DOMAIN OPTIMIZATION OF A MULTI-CHANNEL NEAR-FIELD RF TRANSMITTER, whose entire disclosures are incorporated by reference herein.

Technical Summary

The present invention relates to a method for improving performance of a near field transmitter consisted of multi-channel (multi-input, multi-element) near-field radio frequency (RF) transmit elements, which can optimally generate electromagnetic fields in a range of loads, with application in particular to multi-channel transmit coils used in magnetic resonance imaging (MRI). Furthermore, the invention relates to the control of MRI multi-channel transmit coil performance when excitation of several modes is desired. Preferred applications of the invention are in the areas of MRI and hyperthermia transmitter design, fabrication, and on-site usage. This invention also allows fast and easy on-site maintenance of transmitter hardware.

Field of the Invention

The present invention is concerned with improvements to the procedures used today for fabrication and optimization of devices used for nuclear magnetic resonance imaging ("MRI"), nuclear magnetic resonance spectroscopy ("MRS"), and nuclear magnetic resonance spectroscopy imaging ("MRSI"); and hyperthermia and is directed to an improved transmitter apparatus which can provide a higher value of generated magnetic field in particular anatomis systems, organs and tissues existing within the body of a living subject, and reduced sensitivity of the generated magnetic field to different loads (living subjects) exposed to the transmitter.

Technical Background of the Invention

A large variety of MRI equipment has been developed over time and is conventionally known for imaging purposes. The range and diversity of these developments are represented by U.S. Pat. Nos. 7,573,270; 7,501,823; 7,358.923; 7,358,923; 7,345,485; 7,298,145; 7,285,957; 7,173,425; 7,088,104; 7,088,100; 7,012,429; 6,940,466; 6,853,193; 6,771,070; 6,552,544; 6,538,442; 6,107,798; 6,011,395; 5,998,999; 5,791,648; 5,642,048; 5,610,521; 5,565,779; 5,483,163; 5,483,158; 5,473,252; 5,461,314; 5,365,173; 5,243,286; 5,196,797; 5,185,575; 5,172,061; 5,159,929; 5,081,418; 4,926,125; 4,918,388; 4,885,539; 4,879,516; 4,871,969; 4,820,985; 4,788,503; 4,783,641; 4,780,677; 4,752,736; 4,751,464; 4,737,718; 4,731,584; 4,725,780; 4,721,915; 4,129,822; 4,320,342; and 4,638,253 respectively. All of these are also expressly incorporated by reference herein.

The main MRI applications are in the field of medical imaging. It is important to provide both the highest RF field homogeneity over one or several volumes of interest (VOI), and the best performance, in order to obtain fast and reliable MR images of a patient or volunteer subject, while maintaining a high level of load (subject) independence. The RF field performance is defined as $B_{1+v}/\sqrt{P_{transmit}}$, where $B_{1+v}$ is the transverse magnetic field magnetic field component ($B_{1+}$) with clockwise circular polarization, averaged over the given VOI/VOIs, and $P_{transmit}$ is the power transmitted to the transmitter.

It has been reported that VOI excitation efficiency (expressed as $B_{1+v}/\sqrt{P_v}$, where $P_v$ is the power deposited in a given VOI), varies little over a large range of MRI transmit coil designs, if a transmitter is properly designed, that is, when the non-conservative electric field is ensured to be dominant within the load (which may be a human subject) [M. Kozlov, R. Turner: "Influence of loop array geometry on near field transmit properties at 300 MHz", Proceedings of 2011 IEEE International Symposium on Antennas and Propagation, Spokane, USA, p. 1715-1718, July 2011]. Provided that a given transmitter is properly designed, an obvious approach to improve transmitter performance is to find a way to increase $P_v$. Taking into account the law of conservation of energy, which entails a close interrelation between $P_v$, the power deposited in entire load (subject) ($P_{load}$), the radiated power ($P_{radiated}$) and the internal transmitter losses ($P_{transmitter\_internal}$), an increase of $P_v$ requires:

a) minimization of energy wasting terms, which comprise $P_{radiated}$, $P_{transmitter\_internal}$, and the power reflected by the entire transmitter ($P_{ref\_transmitter}$); and b) maximization of the ratio $P_v/P_{load}$. However, once the transmitter geometry and fabrication design have been fixed, it is only possible to influence $P_{ref\_transmitter}$ and $P_v/P_{load}$.

For a given desired VOI, $P_v/P_{load}$ depends on the transmitter excitation mode or sequential combination of modes. The sequential combination of several circular polarization (CP) modes of an RF transmit transmitter has recently been proposed for some magnetic resonance imaging (MRI) investigations [K. Kim, N. Darji, T. Herrmann, J. Mallow, Z-H. Cho, O. Speck and J. Bernarding: "Improved B1+ field using a 16-channel Transmit Head Array and an 8-channel pTx System at 7T," Proceedings 19th ISMRM, Montreal, Canada, May 2011, p. 3829.]. For example, with 7T head imaging the second circular polarization mode (CP2) excites the brain's periphery efficiently, and for interleaved body excitation a combination of the first circular polarization mode (CP1) and CP2 modes provides good excitation homogeneity. Promising experimental and numerical results from the use of near-field MRI multi-row transmitters have been also reported. These have been operated in various excitation modes, showing better axial coverage and homogeneity over a human head at 300 MHz [G. Adriany, J. Ritter, T. Vaughan, K. Ugurbil, P. -F. Van de Moortele: "Experimental Verification of Enhanced B1 Shim Performance with a Z-Encoding RF Coil Array at 7 Tesla", Proceedings of the 18th Annual Meeting, 2010, p. 3831, May 2010].

It is becoming increasingly important to be able to generate several excitation modes, or more generally to use the adjustment of amplitude and phase of excitation signals (static RF shimming), in order to obtain better homogeneity in a given VOI or part of VOI, when using a multi-channel transmitter [W Gilbert, K M., A T. Curtis, J S. Gati, L M. Klassen, and R S. Menon: "A radiofrequency coil to facilitate B1+ shimming and parallel imaging acceleration in three dimensions at 7 T," NMR Biomed,vol 24., pp 815-823, 2011.]. Such a transmitter is excited by a multi-channel power transmitter unit.

Most near-field radio frequency (RF) transmitters, particularly MRI transmitters, are excited by a signal with a spectrum consisting of one or a few narrow bands. For MRI, the central operating frequency is equal to the Larmor magnetic resonance frequency ($F_{MRI}$). To ensure that the transmitter's field generation performance is optimal over the desired frequency range, variable electrical components connected to the transmitter (for example trim capacitors) are adjusted until the RF fields are efficiently generated in a band around $F_{MRI}$. This procedure is commonly referred as the transmitter optimization procedure, or transmitter tuning. As with any other optimization procedure, MRI transmitter tuning may use simulations and/or systematic practical strategies. These are guided by minimization of an error or cost function (EF), which is a measure of the difference between the actual and desired transmitter conditions. When there are multiple conditions, they are combined (in most cases) in the following expression $$EF = \sum_{allCriteria} w_i \times |Actual_i - Goal_i|^p \qquad (1)$$

Here the EF quantifies the difference between the actual condition ($Actual_i$) and the criterion condition ($Goal_i$) for all of the defined criteria (allCriteria). This difference is usually called a residual. Each residual is raised to a power, p, and the result is then multiplied by a weighting factor, $w_i$. The EF value is determined as the sum of all these terms. The weighting factors (i.e. $w_i$) may have different values from one criterion to another, and they are used to emphasize some optimization criteria versus others by making their contribution to the error function more significant.

The least-squares type of error-function is very popular and implemented in many optimization strategies. The residuals are squared, i.e. p=2, hence the name of this error function formulation.

In some cases EF can be defined as $$EF = \max_{allCriteria} (w_i \times |Actual_i - Goal_i|) \qquad (2)$$

This relative simple definition is commonly used in manual transmitter optimization, in which no specialized hardware or software is used for calculating EF.

For multi-channel RF transmitter fabrication, and in most numerical investigations, the optimization criteria for transmitter performance at the circuit level are based on the following so-called "scattering" parameters [WO 2010/110881 A1]:

a) the element reflection coefficient $S_{xx}$, estimated as the ratio of the voltage associated with an incident wave applied to the input of the element labelled "x" to that of the wave reflected from the same input; and b) the reflection coefficient $S_{xy}$ estimated as the ratio of the voltage of the incident wave applied to the input of the element labelled "x" to that reflected from the element labelled "y".

These quantities are determined at the desired frequency $F_{MRI}$ for a given load, which may be a phantom or a subject. $S_{xx}$ and $S_{xy}$ are quantities defined in the frequency domain, because they are measured (or numerically estimated) in the course of a frequency sweep. Therefore the term "frequency-domain optimization" is used when a transmitter is optimized using $S_{xx}$ and $S_{xy}$.

A commonly used set of optimization criteria is defined (at the desired frequency $F_{MRI}$) as: a) the actual $S_{xx}$ must be less than a target $S_{xx,Target}$ for each transmitter element; b) the actual $S_{xy}$ must be less than a target $S_{xy,Target}$ for each decoupled element pair. Hence $$EF = \sum_{\substack{all\ transmitter \\ elements}} w_{xx\_i} \times |S_{xx\_i} - S_{xx,Target}|^p + \qquad (3)$$

$$\sum_{\substack{all\ decoupled \\ pairs\ of\ transmitter\ elements}} w_{xy\_i} \times |S_{xy\_i} - S_{xy,Target}|^p$$

with:
$w_{xx\_i}$: Weighting factor for the reflection coefficient $S_{xx\_i}$ for the individual transmit element "i", $w_{xy\_i}$: Weighting factor for the reflection coefficient $S_{xy\_i}$ for the "i" decoupled pair of transmit elements $S_{xx,Target}$: Predetermined target value for each element reflection coefficient $S_{xx\_i}$ $S_{xy,Target}$: Predetermined target value for each reflection coefficient $S_{xy\_i}$ For manual optimization, one commonly minimizes simultaneously two error functions $$EF_1 = \max_{\substack{all\_transmitter \\ elements}} (w_{xx\_i} \times |s_{xx\_i} \times S_{xx,Target}|) \qquad (4)$$

$$EF_2 = \max_{\substack{all\_decoupled\_pairs \\ of\_transmitter\_elements}} (x_{xx\_i} \times |S_{xy\_i} - S_{xx,Target}|) \qquad (5)$$

However this strategy can be seriously hampered by a lack of reliable information regarding RF field performance, i.e. $B_{1+}/\sqrt{P_{transmit}}$ specific excitation modes. In general the transmitter elements are not ideally decoupled, i.e. all of $S_{xy\_i}$ are greater than zero. Because $$P_{ref\_transmitter} = a^H \times S^H \times S \times a \qquad (6)$$

(where S—entire scattering matrix, subscript "H" represents complex conjugate transpose), $P_{ref\_transmitter}$ is also non-zero, and consequently $P_v$ depends on the excitation mode (i.e. input excitation vector a).

For a particular mode (or several modes) $P_{ref\_transmitter}$ can amount to a substantial fraction of $P_{transmit}$. This results in severe degradation of the transmitter's efficiency $B_{1+}/\sqrt{P_{transmit}}$.

Due to complexity of equation 6, there is no simple relationship between EF ($EF_1$ and $EF_2$) obtained by equation 3 (or 4 and 5) and $P_{ref\_transmitter}$. By contrast, for example in a multi-row transmitter, the $S_{xy}$ between elements in the same row of a multi-row transmitter, and $S_{xy}$ between elements in different rows, have distinct influences on $P_{ref\_transmitter}$ (and consequently on $B_{1+}/\sqrt{P_{transmit}}$). It has been reported that an transmitter with significantly coupled elements in the same row and good decoupling of elements belonging to different rows provides transmit performance similar to or even better than an transmitter with the same element geometry and fully decoupled elements [M. Kozlov, R. Turner: "Analysis of RF transmit performance for a 7T dual row multichannel MRI loop array," Proceedings of 33rd Annual International Conference of the IEEE EMBS, Boston, USA, p. 547-553, August 2011].

In general, the scattering parameters (as defined by the entire S parameter matrix) are load dependent. Thus to maintain a satisfactory level of $S_{xx}$ and $S_{xy}$ below $S_{xx\_target}$ and $S_{xy\_target}$, in most cases optimization has to be performed again for each load (subject). This is relatively easy to perform for transmitters with a moderate number of elements, but for large number of elements, and especially for a multi-row transmitter, the full procedure is challenging and lengthy, and may not even converge.

It has also been reported that single-row multi-channel transmitters often provide the best $B_{1+}/\sqrt{P_{transmit}}$ for a given excitation mode (e.g. a given static RF shim configuration) if the transmitter is optimized by means of minimization of $P_{ref\_transmitter}$ when only this mode is excited [WO 2011/029452 A1]. Here EF is defined as $$EF = |P_{refl\_transmitter}|^P \qquad (7)$$

When the reflected power minimization approach is applied to transmitter, with a multiple rows in the Z direction, with no dedicated decoupling network within each row, it only succeeds as a transmitter optimization method if axially adjacent transmitter rows are explicitly decoupled, for example by an inductive decoupling network [M. Kozlov, R. Turner: "Analysis of RF transmit performance for a 7T dual row multichannel MRI loop array," Proceedings of 33rd Annual International Conference of the IEEE EMBS, Boston, USA, p. 547-553, August 2011].

For a multi-row transmitter EF is defined as $$EF = \sum_{allrow} w_{r\_i} \times |P_{refl\_row\_i} - o|^P \qquad (8)$$

where $P_{ref\_row\_i}$ is the power reflected by row i, and $w_{r\_i}$ is the weighting factor for the reflected power of the given transmitter row.

$P_{ref\_transmitter}$ is commonly referred as a time-domain quantity because the reflected power was historically measured (or numerically estimated) during a time sweep. Therefore the term "time-domain optimization" is used when $P_{ref\_transmitter}$ is minimized, although state-of-the-art measuring devices and simulation software can also obtain $P_{ref\_transmitter}$ during a frequency domain sweep (e.g. using equation 6). It should be noted that $P_{ref\_transmitter}$ optimization for a given mode provides good load independence [M. Kozlov, R. Turner: "Analysis of Transmit Magnetic Field Homogeneity for a 7T Multi-channel MRI Loop Array,", Progress In Electromagnetics Research Symposium Proceedings, Marrakesh, Morocco, p. 1607-16011, March 2011] but may result in sub-optimal performance for other modes.

The maximum value within a load (subject) of the local specific absorption rate (SAR), and the global SAR, significantly depend on the subject properties, and also on the specific combination of RF amplitudes and phases of individual transmit channels. Consequently, use of any arbitrary mode (arbitrary combination of RF amplitudes and phases of individual transmit channels) requires a reliable real-time SAR monitoring system and SAR prediction for a given subject. The hardware infrastructure required for this is absent from present-day commercially available MRI scanners, resulting in their sub-optimal usage, especially for clinical applications, in which the SAR values permitted by software and hardware constraints are typically much smaller than strictly required for patient safety.

Provision of a limited number of excitation modes (e.g. static RF shimming combinations) is much less complicated and less expensive than enabling arbitrary mode excitation, with its requirement of specialized hardware and software. For this reason, the strategy has been proposed to use multi-element transmitters (multi-row if required) to improve the RF homogeneity, performance and load independence, while using only a limited number of excitation modes [M. Kozlov, R. Turner: "Analysis of RF transmit performance for a multi-row multi-channel MRI loop array at 300 and 400 MHz", Proceedings of the Asia-Pacific Microwave Conference 2011, Melbourne, Australia, p. 1190-1193, December 2011.].

Optimization of a multi-channel near-field RF transmitter in numerical domain and by real fabrication process can be based on exactly the same procedure, because RF circuit and 3-D EM co-simulation allow one to follow the transmitter fabrication stages. In brief, the co-simulation approach entails:

1) substitution of all variable transmitter components (tune, match, decouple networks, etc.) by ports during the simulation of the 3D-EM model, which included a) all transmitter construction details for the resonance elements, b) the load (e.g. human body model), and c) transmitter environment (e.g. MRI scanner gradient shield, magnet bore, etc), all simulated with precise dimensions and material electrical properties;

2) reconnection the variable components during simulation of RF circuit (e.g. MRI scanner circuit);

3) obtaining network component values by circuit optimization;

4) a simple computation (weighted sum of already calculated quantities) of the final 3D electromagnetic field distribution; and 5) finally calculation of transmitter properties (e.g. RF field performance, etc.).

Stage #1 corresponds to fabrication of the transmitter elements and their assembly in the final transmitter geometry.

The stage #2 corresponds to soldering-in of the variable components.

Stage #3 corresponds to transmitter optimization procedure.

Stage #4 mimics the measuring of transmitter fields (e.g. obtaining of B1+ mapping by an MRI experiment).

Stage #5 corresponds post-processing of transmitter experimental data for calculating transmitter properties.

WO 2011/029452 A1 discloses an optimization method for a multi-channel transmitter, wherein an optimization criterion is calculated based on the reflected power only.

Objective of the Invention

It is an objective of the present invention to provide a reliable and relatively fast method for multi-channel near-field RF transmitter (e.g. MRI transmitter) optimization, and on-site usage, which supports multi-mode (e.g. a set of static RF shims) excitation for several loads (subjects), without transmit performance degradation (in opposite with performance improvement for most of excitation modes) for these modes and loads (subjects). The method is based on use of a multi-mode, multi-load, and multi-domain optimization. A further objective of the invention is to provide a method for load (subject) independence of transmitter transmit properties and maintenance (keeping without essential decrease) of safety excitation efficiency when in time interleave excitation is applied.

These objectives are achieved with methods and devices as defined in the independent claims. Advantageous embodiments and applications of the invention are defined in the dependent claims.

SUMMARY OF THE INVENTION

According to the first aspect of the invention, a method is provided for the optimization of performance of a multi-channel near-field RF transmitter, which is used for excitation of at least one mode, in one subject. The method improves RF power efficiency, keeping optimal RF homogeneity (or RF focusing into given volume of interest (VOI) if it is requested). All transmitter elements are simultaneously excited with a specific RF power signal of fixed amplitude and phase, as it is required for obtaining optimal RF homogeneity or RF focusing for given VOI. In this method, optimization of RF power efficiency is achieved by simultaneous usage of time and frequency domain optimization of the transmitter:

$$EF = \sum_{\substack{all\ transmitter \\ elements}} w_{xx\_i} \times |S_{xx\_i} - S_{xx,Target}|^p + \sum_{\substack{all\ decoupled \\ pairs\ of\ transmitter\ elements}} w_{xy\_i} \times |S_{xy\_i} - S_{xy,Target}|^p + w_{refl} \times |P_{Refl\_transmitter}|^p \quad (9)$$

with:
EF: Optimization criterion
$w_{xx\_i}$: Weighting factor for the reflection coefficient $S_{xx\_i}$ for the individual transmit element "i",
$w_{xy\_i}$: Weighting factor for the reflection coefficient $S_{xy\_i}$ for the "i" decoupled pair of transmit elements
$S_{xx,Target}$: Predetermined target value for each element reflection coefficient $S_{xx\_i}$
$S_{xy,Target}$: Predetermined target value for each reflection coefficient $S_{xy\_i}$
$w_{refl}$: Weighting factor for reflected power of the entire multi-channel transmitter
$P_{Refl\_transmitter}$: reflected power of the entire multi-channel transmitter.

The inventive step utilizes the fact that Equation 6 provides calculation for the third term of the EF, measurement (or calculation in numerical domain) of S parameter matrix is sufficient for EF estimation and performing entire optimization.

As its principal advantages, this inventive method ensures that transmit performance is optimal for given excitation mode.

According to the second aspect of the invention, a method is provided for the optimization of performance of a multi-channel near-field RF transmitter, which is used for excitation of at least two modes, in one subject. The method improves RF power efficiency, keeping optimal RF homogeneity (or RF focusing into given volume of interest (VOI) if it is requested). All transmitter elements are simultaneously excited with a specific RF power signal of fixed amplitude and phase, during given mode excitation, as it is required for obtaining optimal RF homogeneity or RF focusing for given VOI. In this method, optimization of RF power efficiency is achieved by simultaneous usage of time and frequency domain optimization of the transmitter, and optimization transmitter to ensure minimum of $P_{refl\_transmitter}$ is obtained for all given excitation modes.

$$EF = \sum_{\substack{all\ transmitter \\ elements}} w_{xx\_i} \times |S_{xx\_i} - S_{xx,Target}|^p + \sum_{\substack{all\ decoupled \\ pairs\ of\ transmitter\ elements}} w_{xy\_i} \times |S_{xy\_i} - S_{xy,Target}|^p + \sum_{all\ modes} w_{m\_i} \times |P_{Refl\_transmitter\_i}|^p \quad (10)$$

with:
EF: Optimization criterion
$w_{xx\_i}$: Weighting factor for the reflection coefficient $S_{xx\_i}$ for the individual transmit element "i"
$w_{xy\_i}$: Weighting factor for the reflection coefficient $S_{xy\_i}$ for the "i" decoupled pair of transmit elements
$S_{xx,Target}$: Predetermined target value for each element reflection coefficient $S_{xx\_i}$
$S_{xy,Target}$: Predetermined target value for each reflection coefficient $S_{xy\_i}$
$w_{m\_i}$: Weighting factor for reflected power of the entire multi-channel transmitter for given transmit mode "i"
$P_{Refl\_transmitter\_i}$: reflected power of the entire multi-channel transmitter for given transmit mode "i".

According to the third aspect of the invention, a method is provided for the optimization of performance of a multi-channel near-field RF transmitter, which is used for excitation of at least two modes, in at least two subjects. The method improves RF power efficiency, keeping optimal RF homogeneity (or RF focusing into given volume of interest (VOI) if it is requested). All transmitter elements are simultaneously excited with a specific RF power signal of fixed amplitude and phase, during given mode excitation, as it is required for obtaining optimal RF homogeneity or RF focusing for given VOI. In this method, optimization of RF power efficiency is achieved by simultaneous usage of time and frequency domain optimization of the transmitter, simultaneous optimization for all loads (subjects), optimization transmitter to ensure minimum of $P_{refl\_transmitter}$ is obtained for all given excitation modes.

$$EF = \sum_{all\ loads} \left[ \sum_{all\ transmitter} w_{xx\_i} \times |S_{xx\_i} - S_{xx,Target}|^p + \sum_{\substack{all\ decoupled \\ pairs\ of\ transmitter\ elements}} w_{xy\_i} \times |S_{xy\_i} - S_{xy,Target}|^p + \sum_{all\ modes} w_{m\_i} \times |P_{Refl\_transmitter\_i}|^p \right] \quad (11)$$

with:
EF: Optimization criterion
$w_{xx\_i}$: Weighting factor for the reflection coefficient $S_{xx\_i}$ for the individual transmit element "i"
$w_{xy\_i}$: Weighting factor for the reflection coefficient $S_{xy\_i}$ for the "i" decoupled pair of transmit elements
$S_{xx,Target}$: Predetermined target value for each element reflection coefficient $S_{xx\_i}$
$S_{xy,Target}$: Predetermined target value for each reflection coefficient $S_{xy\_i}$
$w_{m\_i}$: Weighting factor for reflected power of the entire multi-channel transmitter for given transmit mode "i"

$P_{Refl\_transmitter}$: reflected power of the entire multi-channel transmitter for given transmit mode "i".

The quantities $S_{xx\_i}$, $S_{xy\_i}$, $P_{Refl\_transmitter\_i}$ are dependent on the transmitter loading. Thus EF represents the sum over all loads.

The index for load is not included in equation 11 to assist readability of the equation.

According to the 4st aspect of the invention, a method is provided for the optimization of performance of a multi-channel near-field RF transmitter, which is used for excitation of at least one mode, in at least one subject in time interleave RF excitation. The method improves RF power efficiency, keeping optimal RF homogeneity (or RF focusing into given volume of interest (VOI) if it is requested) and safety excitation efficiency. All transmitter elements are excited sequentially in time with a specific RF power signal of fixed amplitude and phase, during given mode excitation, as required for obtaining optimal RF homogeneity or RF focusing for given VOI. In this method, optimization of RF power efficiency and maintenance of safety excitation efficiency are achieved by simultaneous usage of time and frequency domain optimization of the transmitter, simultaneous optimization for simultaneous and in time interleave excitation.

$$EF = \sum_{\substack{all\ transmitter \\ elements}} w_{xx\_i} \times |S_{xx\_i} - S_{xx,Target}|^P + \qquad (12)$$

$$\sum_{\substack{all\ decoupled \\ pairs\ of\ transmitter\ elements}} w_{xy\_i} \times |S_{xy\_i} - S_{xy,Target}|^P + w_{refl} \times$$

$$|P_{Re\ fl\_transitter}|^P + \sum_{N_{is}} w_{t\_i} \times \left|P_{Refl\_transmitter\_is\_i} - \frac{P_{Transmit}}{N_{is}}\right|^P$$

with:
EF: Optimization criterion
$w_{xx\_i}$: Weighting factor for the reflection coefficient $S_{xx\_i}$ for the individual transmit element "i"
$w_{xy\_i}$: Weighting factor for the reflection coefficient $S_{xy\_i}$ for the "i" decoupled pair of transmit elements
$S_{xx,Target}$: Predetermined target value for each element reflection coefficient $S_{xx\_i}$
$S_{xy,Target}$: Predetermined target value for each reflection coefficient $S_{xy\_i}$
$w_{t\_i}$: Weighting factor for reflected power of the entire multi-channel transmitter for given interleave stage "i"
$P_{Refl\_transmitter\_is\_i}$: Reflected power of the multi-channel transmitter during given interleave stage "i"
$P_{Transmit}$: Power transmitted by the multi-channel transmitter
$N_{is}$: Number of interleave stages.

DETAILED DESCRIPTION OF THE INVENTION

The present invention provides an improved transmitter performance at a specified frequency and for given excitation modes and loads (subjects); and provides performance which is highly independent of the transmitter loading. The design of the improved optimization procedure is a unique achievement and represents an unpredicted advance in this technical field.

For given transmitter geometry and set of operation modes, only the circuit optimization step has an influence on the transmitter performance. To overcome the limitations of optimization in each domain, time and frequency, and improve transmitter load independence we implemented multi-mode, multi-load, and multi-domain optimization of multi-channel near-field RF transmitters.

A new set of optimization criteria, defined at transmitter operation frequency (e.g. $F_{MRI}$) consisted of individually weighted criteria:
a) the actual $S_{xx}$ must be less than a target $S_{xx,Target}$, for each transmitter element;
b) the actual $S_{xy}$ must be less than a target $S_{xy,Target}$, for each decoupled element pair; and
c) for minimization to zero of $P_{ref\_transmitter}$ in each operation mode. EF is calculated on base of data for set of loads (e.g. set of subjects) that represents as close as possible expected operation loading conditions.

$$EF = \sum_{all\ loads} \left[ \begin{array}{c} \sum_{\substack{all\ transmitter \\ elements}} w_{xx\_i} \times |S_{xx\_i} - S_{xx,Target}|^P + \\ \sum_{\substack{all\ decoupled \\ pairs\ of\ transmitter\ elements}} w_{xy\_i} \times |S_{xy\_i} - S_{xy,Target}|^P + \\ \sum_{all\ modes} w_{m\_i} \times |P_{Refl\_transmitter\_i}|^P \end{array} \right]$$

For example, the new optimization procedure results in 8 or 24 criteria for $S_{xx}$ (i.e. all transmitter element is equal to 8 or 24), and 8 or 72 criteria for $S_{xy}$ (i.e. all_decoupled_pairs_of_transmitter_elements is equal to 8 or 72). For both transmitters, components to be optimized are: the matching capacitor for each element matching network, the tuning capacitor for each element tuning network, mutual inductance between decoupling inductors for each decoupling network. This resuited in 24 or 120 optimization variables for the single row transmitter, or the triple row transmitter respectively.

Initial guesses are made, based on numeral simulation experience or experimental knowledge, for the values of adjustable multi-channel transmitter lumped elements, as well as the range over which adjustable elements can be varied.

For the single row transmitters, each optimization can be performed in two steps: 3000 random tries, followed by "Quasi-Newton" optimization until no further improvement was possible. This ensures that the global minimum condition had been found. It takes less than 1 minute to compute the values of all variable components for a given set of individually weighted criteria. All weight factors can be equal to 1 for the first optimization trial. If $P_{ref\_transmitter}$ in one mode was still more than 5% of $P_{transmit}$ the weight factor of the criterion for $P_{ref\_transmitter}$ was step by step increased by 1.0 until the worst case value of $P_{ref\_transmitter}$ was less than 5% of $P_{transmit}$ for all excitation modes.

For double and triple row transmitters, the optimization approach described above could be insufficient to provide global optimization, because the number of independent optimization variables is too high for the entire optimization space to be covered by 3000 random tries. Simply increasing the number of random tries did not help, because the required number of tries becomes so large that optimization time becomes unacceptably long. To keep optimization time at a reasonable level (a few minutes), a two stage optimization approach is implemented for transmitter with cylindrical (or close to cylindrical symmetry). Despite the asymmetry of the human head model, the cylindrical symmetry of the elements in each transmitter row ensured that the value of adjustable elements of the tuning and decoupling networks were relatively similar, within the same row. Thus preliminary values of optimization variables are obtained by performing the first stage optimization with independent variables grouped for each row and each type of network. This approach reduces number of independent optimization variables from 120 to 15 for the triple row transmitter. As a result 3000 random tries becomes reasonable for approaching preliminary values of optimization variables.

At the second stage, using the "Quasi-Newton" method, optimization values for all ungrouped independent variables are obtained, when the optimizer reports that no further improvement is possible. To ensure (to some extent) that the two stage optimization approached global minimum condition, a multi-start strategy has to be used. This consists of re-running both stages of the optimization several (e.g. five) times with different initial conditions. If the data spread was small (less than 5% peak to peak variation of both optimization variables and quantitative results) then the multi-start was considered to be sufficient for obtaining optimized value of independent variables with about 5% uncertainty. If the data spread was not small, the multi-start procedure is performed 5 times more. When the best optimization of both multi-start tries reaches similar end error values, and the peak-to-peak variation in their optimization variables and results is less than 5%, the optimization procedure is stopped, and values from the best optimization try are considered as the final result. Each dual stage optimization takes about 2 minutes: thus, in most cases, the entire multi-row transmitter circuit optimization require about 10 minutes, a much shorter time as compared with the about one day taken for 3D-EM simulation of a multi-row transmitter using an up-to-date Dell Precision T7500 Workstation with 64 GB RAM and 12 cores.

The number of individual transmitter elements (coils) that need to be excited simultaneously may exceed the number of independent transmit channels available at the MRI scanner. A solution—excitation of transmitter elements that are interleaved in time—has been successfully implemented. However, this important experimental work has not yet provided data regarding safety (primary safety excitation efficiency $B_{1+}/\sqrt{SAR_{10g}}$) implications.

To keep the same nuclear spin rotation, and correspondingly $B_{i+v}$, the amplitude of the excitation signal must be increased by the number of interleaves used in the excitation ($N_{IS}$), provided that there is zero time delay between steps. This results in an increase of power transmitted to each transmitter coil element by a factor of $N_{IS}$, compared with simultaneous excitation of all transmitter elements. The transmitter is a linear system and its E- and magnetic (B) fields can be obtained as the linear complex superposition of the fields for each individual transmitter element obtained for unit excitation, after weighting by the corresponding elements of the voltage excitation vector. But none of the transmitter's scalar field derived quantities, for instance power loss density, SAR or power deposited in given tissue, can be superposed linearly.

Two major factors, to some extent correlated, determine the power deposited in the entire tissue ($P_{load}$), the corresponding global SAR, and its distribution in a multi-row transmitter. These are a) the law of conservation of energy; b) the constructive and destructive interference of E-fields. Due to the first factor, since the transmitters are not ideally decoupled, the power reflected by the entire transmitter ($P_{refl\_transmitter}$), and consequently $P_{load}$, which must always be less than the transmit power ($P_{transmit}$), depend on the excitation vector. Considering the second factor, the E-field superposition cannot only be constructive, because if this were the case $P_{load}$ would approach a value equal to $N_{elem} \cdot P_{transmit}$, where $N_{elem}$ is the number of elements in the transmitter, thus invalidating the law of conservation of energy. In an interesting extreme case, the more destructive the E-field interference between transmitter elements, the greater the power reflected by the entire transmitter.

In the worst case condition, interleaved excitation resulted in an increase of $P_{load}$ and $SAR_{10g}$ (decrease safety excitation efficiency) by a factor of $N_{IS}$. However, a usefully different behavior is discovered for a specific configuration. With interleaved excitation, element coupling can result in significant power reflected by transmitter at each interleave stage ($P_{refl\_transmitter\_is}$). If the excitation profiles from each interleave are well spatially separated, large $P_{refl\_transmitter\_is}$ results in that the power deposition, $SAR_{10g}$, and safety excitation efficiency of interleaved excitation remain similar to those for simultaneous excitation.

In the context of the invention, the term "multi-channel transmitter" preferably refers to a transmitter comprising several radiative coil elements, wherein each radiative coil element preferably comprises an individual input forming an input channel of the multi-channel transmitter. Therefore, the input channels of the multi-channel transmitter can be driven with individual excitation signals.

The radiative coil elements of the multi-channel transmitter can be arranged in a row or in a column. Alternatively, the coil elements can be arranged in a transmitter comprising several rows of coil elements and several columns of coil elements.

DETAILED DESCRIPTION OF THE DRAWINGS

Figure 1A:
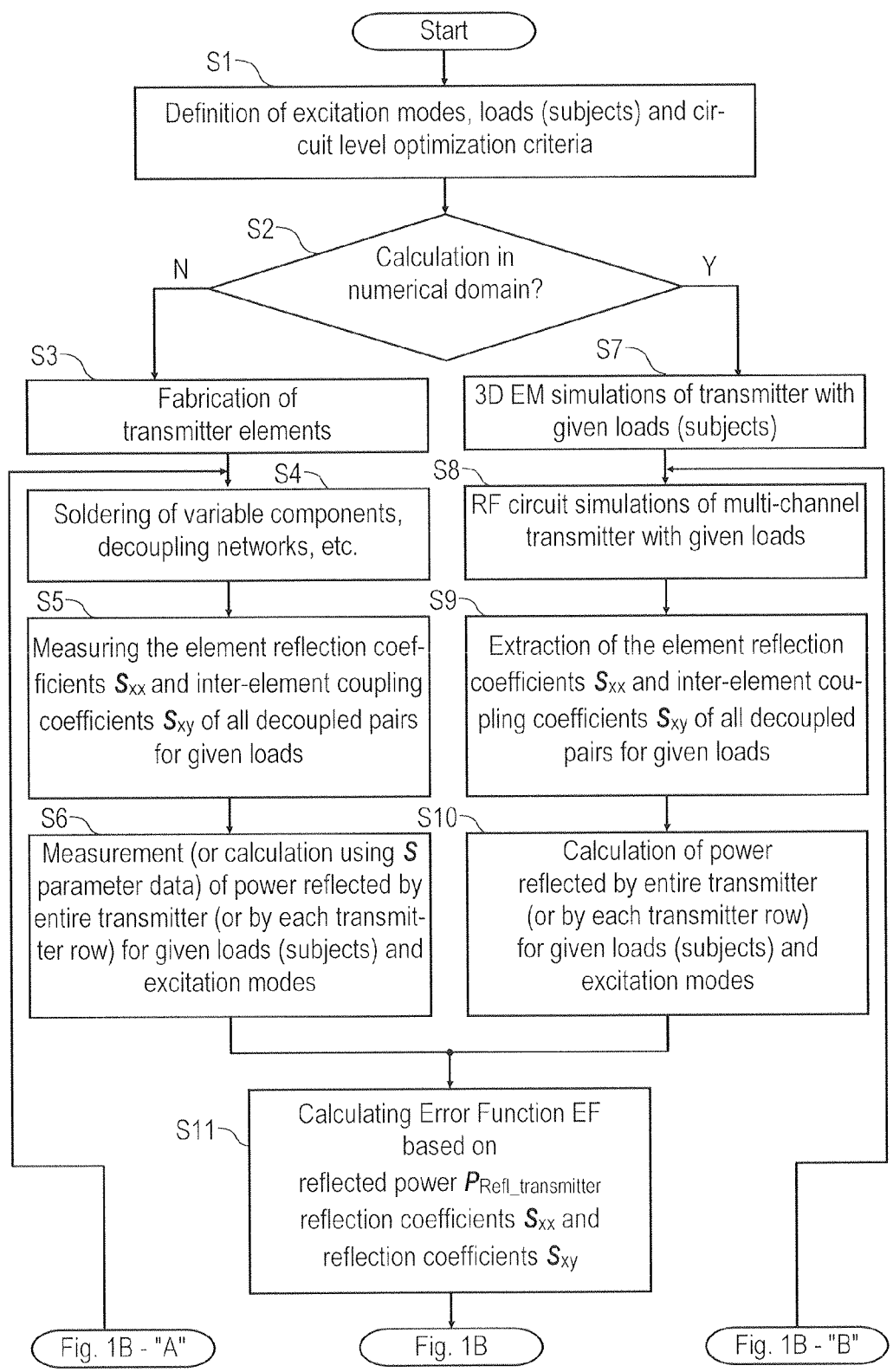
FIGS. 1A and 1b show a flowchart illustrating an optimization method according to the invention.
Figure 1B:
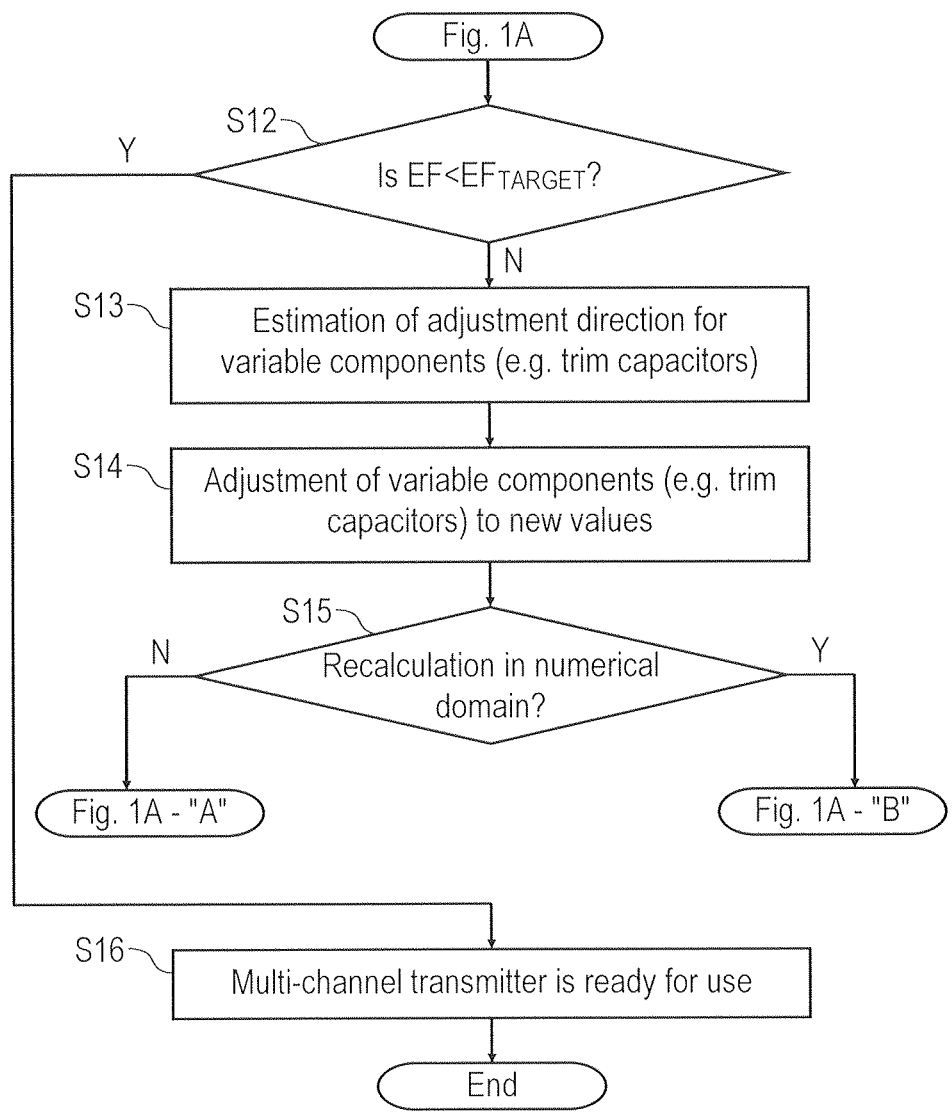
Figure 2A:
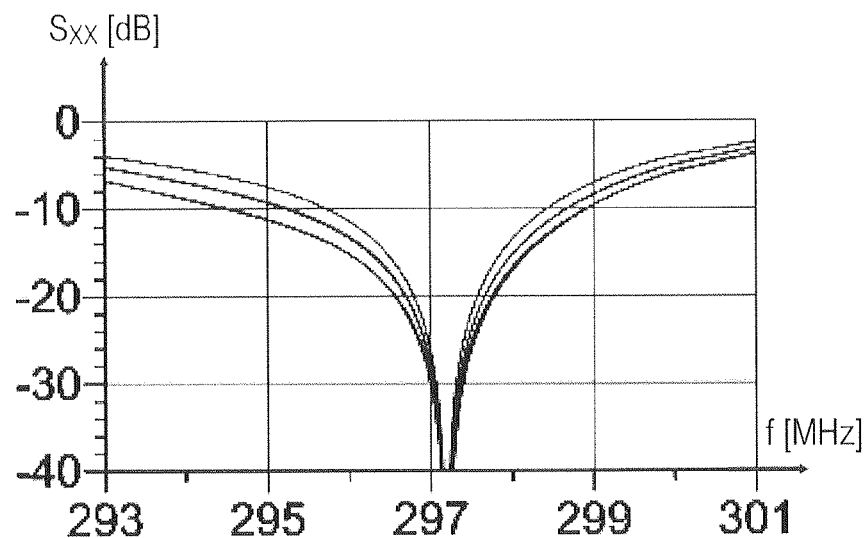
FIG. 2A shows the frequency dependence of the reflection coefficient $S_{xx}$ for a frequency domain optimization.
Figure 2B:
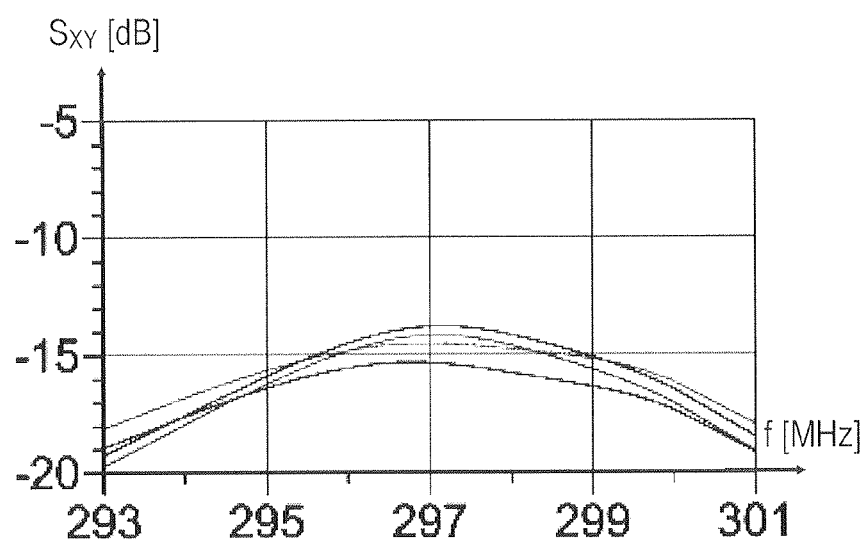
FIG. 2B shows the frequency dependence of the reflection coefficient $S_{xy}$ for a frequency domain optimization.
Figure 2C:
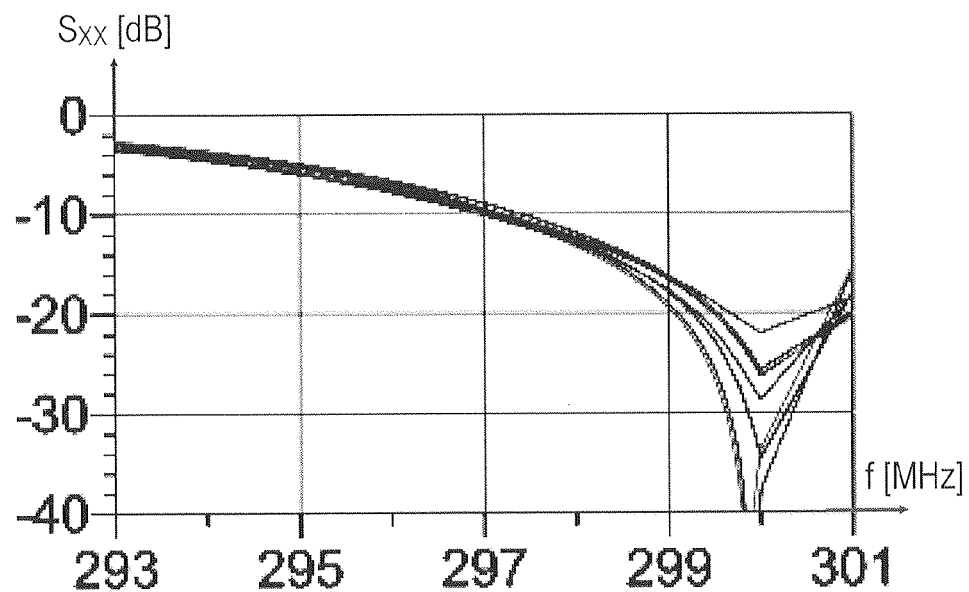
FIG. 2C shows the frequency dependence of the reflection coefficient $S_{xx}$ for a dual domain optimization both in the frequency domain and in the time domain.
Figure 2D:
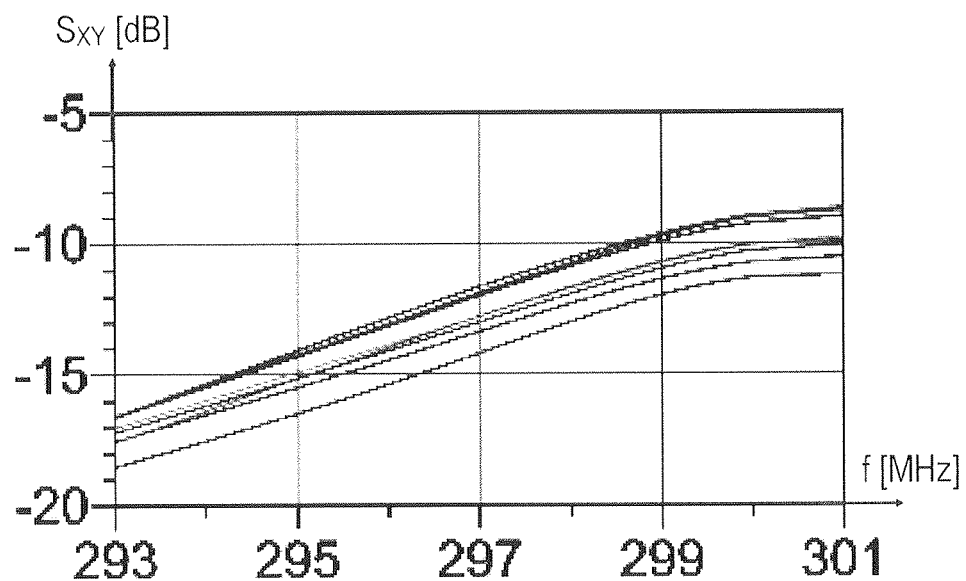
FIG. 2D shows the frequency dependence of the reflection coefficient $S_{xy}$ for a dual domain optimization both in the frequency domain and in the time domain.

In the following, the flowcharts shown in FIGS. 1A and 1B are described.

In a first step S1, excitation modes are defined for excitation of the multi-channel transmitter. Further, loads (subjects) of the multi-channel transmitter are defined and circuit level optimization criteria are determined.

In a second step S2, a decision is made whether the optimization is performed in numerical domain or using measurements of a real multi-channel transmitter.

In the following, steps S3-S6 are explained which refer to the optimization using measurement data of a real multi-channel transmitter.

In step S3, the coil elements of the multi-channel transmitter are manufactured.

Then, in step S4, the other components (e.g. trim capacitors, decoupling networks, etc.) of the multi-channel transmitter are soldered.

In step S5, the reflection coefficients $S_{xx}$ of all transmitter elements and the reflection coefficients $S_{xy}$ of all decoupled pairs of transmitter elements are measured for given loads. The reflection coefficients $S_{xx}$ represent a signal ratio between an incident wave applied to the x-th coil element of the multi-channel transmitter and a resulting wave reflected from the x-th coil element of the multi-channel transmitter.

The reflection coefficients $S_{xy}$ represent a signal ratio between an incident wave applied to the x-th coil element of the multi-channel transmitter and a resulting wave reflected from the y-th coil element of the multi-channel transmitter.

In step S6, the power $P_{Refl\_transmitter}$ reflected by the entire transmitter, or by each transmitter row is measured or calculated using S parameter data for given loads (subjects) and excitation modes.

In the following, the corresponding steps S7-S10 are explained which relate to the calculation of the aforementioned data in numerical domain.

In step S7, three-dimensional electro-magnetic simulations of the multi-channel transmitter are calculated with given loads (subjects).

Then, in step S8, RF circuit simulations of the multi-channel transmitter with given loads are calculated.

In step S9, the element reflection coefficients $S_{xx}$ and the reflection coefficients $S_{xy}$ of all decoupled pairs of transmitter elements are extracted for given loads.

Further, in step S10, the reflected power is calculated for given loads (subjects) and excitation modes.

In step S11, an error function EF is calculated wherein the error function EF is an optimization criterion. The error function is calculated on the basis of the reflected power $P_{Refl\_transmitter}$, the reflection coefficients $S_{xx}$ and the reflection coefficients $S_{xy}$ according to the following formula:

$$EF = \sum_{all\ loads} \begin{bmatrix} \sum_{\substack{all\ transmitter \\ elements}} w_{xx\_i} \times |S_{xx\_i} - S_{xx,Target}|^P + \\ \sum_{\substack{all\ decoupled \\ pairs\ of\ transmitter\ elements}} w_{xy\_i} \times |S_{xy\_i} - S_{xy,Target}|^P + \\ \sum_{all\ modes} w_{m\_i} \times |P_{Re\ fl\_transmitter\_i}|^P \end{bmatrix}$$

Then, in step S12, the value of the error function EF is compared with a predetermined target value $EF_{Target}$.

If the actual value of the error function EF is smaller than the predetermined target value $EF_{Target}$, then it is determined in step S16 that the multi-channel transmitter is ready for use.

Otherwise, step S13 estimates the adjustment direction for variable components (e.g. trim capacitors) of the multi-channel transmitter.

In step S14, the variable components (e.g. trim capacitors) are adjusted to new values.

In step S15, it is determined whether a recalculation is made in the numerical domain or not, if so, the method continuous with step S8 in FIG. 1A. Otherwise, the method continuous with step S4 in FIG. 1A.

Example Data

Figure 4:
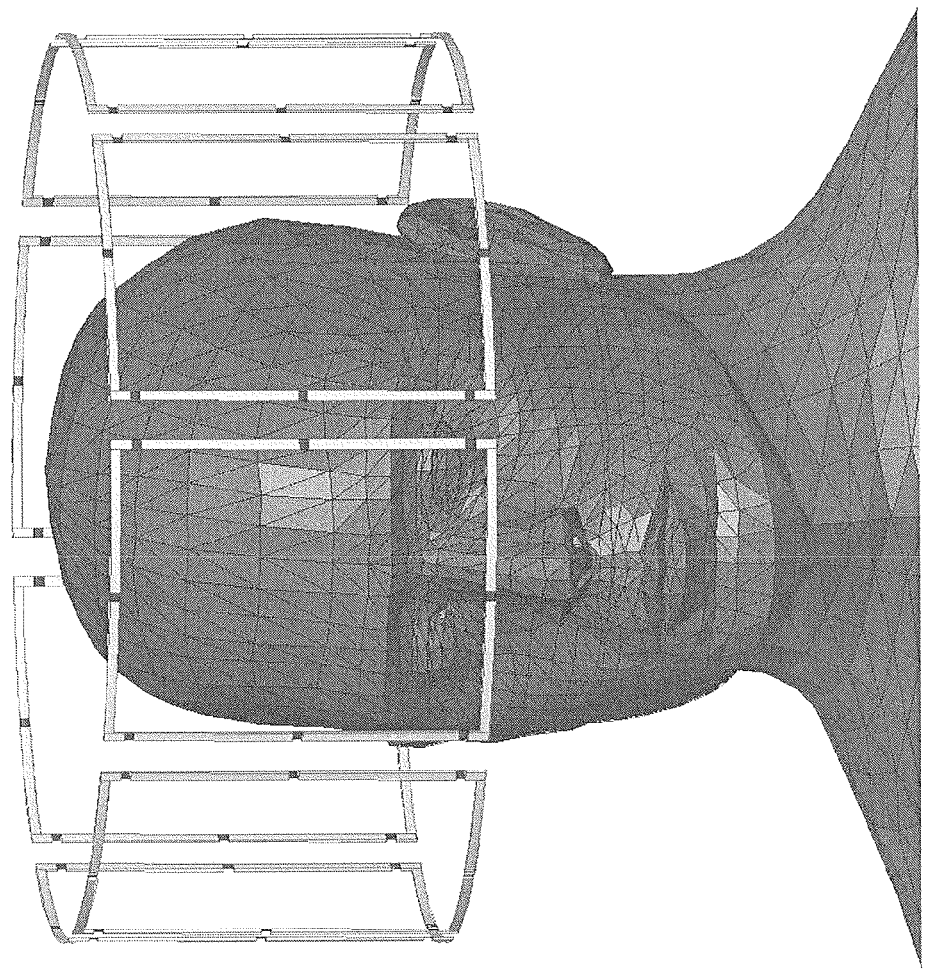
FIG. 4 shows the investigated single row transmitter comprised of 8 channels with identical rectangular loops of length 120 mm and the angular size 40 degrees, mounted on a cylindrical acrylic former with diameter of 280 mm.
Figure 5:
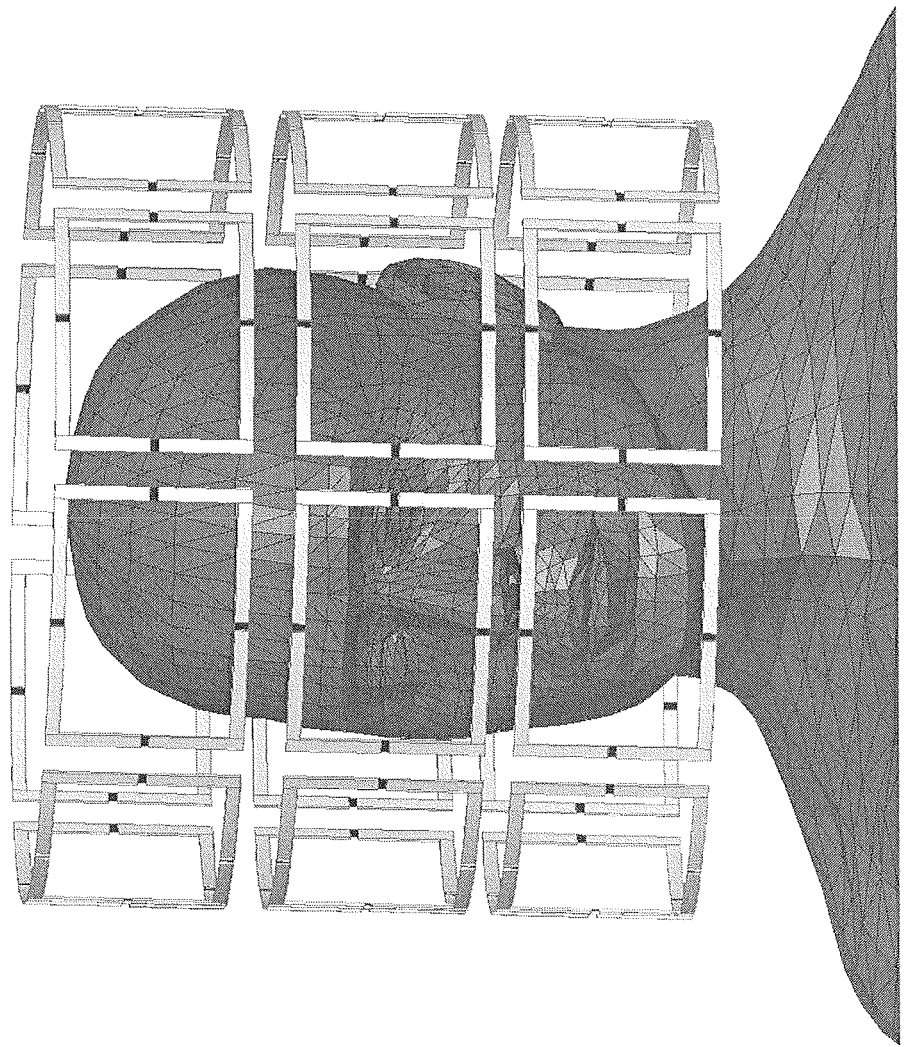
FIG. 5 shows the investigated triple-row transmitter, each non-overlapped row is comprised by 8 identical rectangular loops of length 70 mm and the angular size 40 degrees, mounted on a cylindrical acrylic former with diameter of 280 mm.

The geometry of the single and multi-row loop-based transmitters that we investigated is described in [M. Kozlov, R. Turner: "Analysis of RF transmit performance for a multi-row multi-channel MRI loop array at 300 and 400 MHz", Proceedings of the Asia-Pacific Microwave Conference 2011, Melbourne, Australia, p. 1190-1193, December 2011; M. Kozlov, R. Turner, "Influence of loop array geometry on near field transmit properties at 300 MHz", Proceedings of 2011 IEEE International Symposium on Antennas and Propagation, Spokane, USA, p. 1715-1718, July 2011]. For example: a) the investigated single row transmitter is comprised of 8 channels with identical rectangular loops of length 120 mm and the angular size 40 degrees, mounted on a cylindrical acrylic former with diameter of 280 mm (cf. FIG. 4); b) the investigated triple-row transmitter, each non-overlapped row is comprised by 8 identical rectangular loops of length 70 mm and the angular size 40 degrees, mounted on a cylindrical acrylic former with diameter of 280 mm (cf. FIG. 5). The realistic 3-D EM model of the transmitters included all construction details for the resonance elements, simulated with precise dimensions and material electrical properties. The loads utilized were the multi-tissue Ansoft human body models, cut in the middle of the torso, with different scaling factors: a medium-size head #1 with scaling X=0.9, Y=0.9, Z=0.9, a large-size (almost fully occupying the transmitter volume when the diameter was 250 mm) head #2 with scaling X=0.95, Y=0.975, Z=0.9, and a small-size head #3 with scaling X=0.85, Y=0.85, Z=0.9. To investigate transmitter transmit performance sensitivity to load position, the latter was varied.

The RF circuit simulator was Agilent ADS 2011.10, and Ansoft HFSS 14 was chosen as the 3-D EM tool.

For the single row 8-element transmitter, or for the triple row transmitter, where each non-overlapped row is correspondingly comprised of 8 identical rectangular loops, components to be optimized are: the matching capacitor for each element matching network, the tuning capacitor for each element tuning network, the decoupling capacitor or mutual inductance between decoupling inductors for each decoupling network. This results in 24 or 120 optimization variables for the single row transmitter, or the triple row transmitter respectively.

Initial guesses are made (based on numeral simulation, experience, or experimentally derived knowledge) for the values of adjustable lumped elements, as well as the range over which adjustable elements can be varied.

For the single row transmitters, each optimization can be performed in two steps: 3000 random tries, followed by "Quasi-Newton" optimization until no further improvement was possible. This ensures that the global minimum condition has been found. It takes less than 1 minute to compute the values of all variable components for a given set of individually weighted criteria. All weight factors can be equal to 1 for the first optimization trial. If $P_{refl\_transmitter}$ in one mode was still more than 5% of $P_{transmit}$ the weight factor of the criterion for $P_{refl\_transmitter}$ was step by step increased by 1.0 until the worst case value of $P_{refl\_transmitter}$ was less than 5% of $P_{transmit}$ for all excitation modes.

For double and triple row transmitters, the optimization approach described above could be insufficient to provide global optimization, because the number of independent optimization variables is too high for the entire optimization space to be covered by 3000 random tries. Simply increasing the number of random tries does not help, because the required number of tries becomes so large that the optimization time becomes unacceptably long. To keep optimization time at a reasonable level (a few minutes), a two stage optimization approach is implemented for transmitters with cylindrical (or close to cylindrical symmetry). Despite the asymmetry of the human head model, the cylindrical symmetry of the elements in each transmitter row ensures that the value of adjustable elements of the tuning and decoupling networks are relatively similar, within the same row.

Thus the preliminary values of optimization variables are obtained by performing the first stage optimization with independent variables grouped for each row and each type of network. This approach reduces the number of independent optimization variables from 120 to 15 for the triple row transmitter. As a result, the use of 3000 random tries becomes reasonable for approaching the preliminary values of optimization variables.

At the second stage, using the "Quasi-Newton" method, optimized values for all ungrouped independent variables are obtained when the optimizer reports that no further improvement is possible. To ensure (to some extent) that the two stage optimization approaches global minimum condition, a multi-start strategy should be used. This consists of re-running both stages of the optimization several (e.g. five) times with different initial conditions. If the data spread is small (less than 5% peak to peak variation of both optimization variables and quantitative results) then the multi-start is considered to be sufficient for obtaining optimized values of independent variables with about 5% uncertainty. If the data spread is not small, the multi-start procedure is performed 5 times more. When the best optimization of both multi-start tries reaches similar final error values, and the peak-to-peak variation in their optimization variables and results is less than 5%, the optimization procedure is stopped, and values from the best optimization try are considered as the final result. Each dual stage optimization takes about 2 minutes: thus, in most cases, the entire multi-row transmitter circuit optimization require about 10 minutes, much faster than the approximately one day required for 3D-EM simulation of a multi-row transmitter using an up-to-date Dell Precision T7500 Workstation with 96 GB RAM and 12 cores.

The time-domain only optimization, guided by EF defined in (5), resulted in $P_{refl\_transmitter}$=0, and the best performance for optimization of the excitation mode. In other modes $P_{refl\_transmitter}$ could approach 40% of $P_{transmit}$ and performance was sub-optimal.

In the CP1 mode, optimization in the frequency domain resulted in relatively small $P_{refl\_transmitter}$ (less than 10% of $P_{transmit}$), thus ensuring almost the best performance. This was guided by EF defined in (1) with only adjacent elements included in the decoupled element pair list, $S_{xx,Target}$=−30 dB, $S_{xy,Target}$=−20 dB and all weighting factors equal to 1. However, in the CP2 mode, $P_{refl\_transmitter}$ was significantly larger (mostly more than 25% of $P_{transmit}$). Consequently the transmit performance in the CP2 mode was significantly reduced. For a given mode $B_{1+}$ homogeneity was similar after both optimizations.

Extension of the decoupled element pair list by including also all second-neighbour pairs did not essentially improve CP2 mode transmit performance, compared with the original frequency domain optimization.

Dual-domain optimization resulted in negligible $P_{refl\_transmitter}$ (less than 3% of $P_{transmit}$) for both CP1 and CP2 modes, provided that coupling to the second-neighbour elements was less than −9 dB after frequency domain optimization. In this condition, the coupling between the second-neighbour elements decreased by 4 to 8 dB, but the single resonance element matching became relatively poorer (in the range −10 dB to −15 dB), and adjacent element coupling increased by 3 to 5 dB. Thus, despite giving the best transmit performance in the desired excitation modes, both the frequency dependence of $S_{xx}$ (i.e. element matching) and $S_{xy}$ (i.e. the coupling between adjacent elements) resemble the corresponding frequency dependence of a sub-optimal, badly tuned transmitter (FIG. 2A-2D).

To mimic a sub-optimally tuned transmitter, obtained after in the frequency domain optimization, $S_{xy,Target}$ and $S_{xy,Target}$ were changed to be −10 dB and −12 dB respectively. Starting the optimization from several different initial conditions, a set of optimization results was obtained for several transmitter geometries. Despite the very similar visual appearance of the frequency dependence of element matching and coupling between adjacent elements for all tuning parameters (plotted in dB scale), the transmit performance showed highly significant variation, from very sub-optimal ($P_{refl\_transmitter}$ about 30% of $P_{transmit}$) to nearly the best ($P_{refl\_transmitter}$~0). This finding has a rational explanation: from (4) $P_{refl\_transmitter}$ depends on all the interactions within the transmitter (not only the subset of interactions described by element matching and coupling between adjacent elements), and also on the phases of coupling between adjacent elements, which are rarely analysed.

It is becoming increasingly important to be able to generate not only several fundamental excitation modes, but also to have ability to adjust amplitude and phase of excitation signals for given fundamental excitation mode (to apply so-called static RF shimming), in order to obtain better homogeneity in a given VOI or part of VOI.

FIGS. 3A-3D show Monte Carlo histograms of a ratio $P_{refl\_transmitter}/P_{transmit}$ in percent.

Figure 3A:
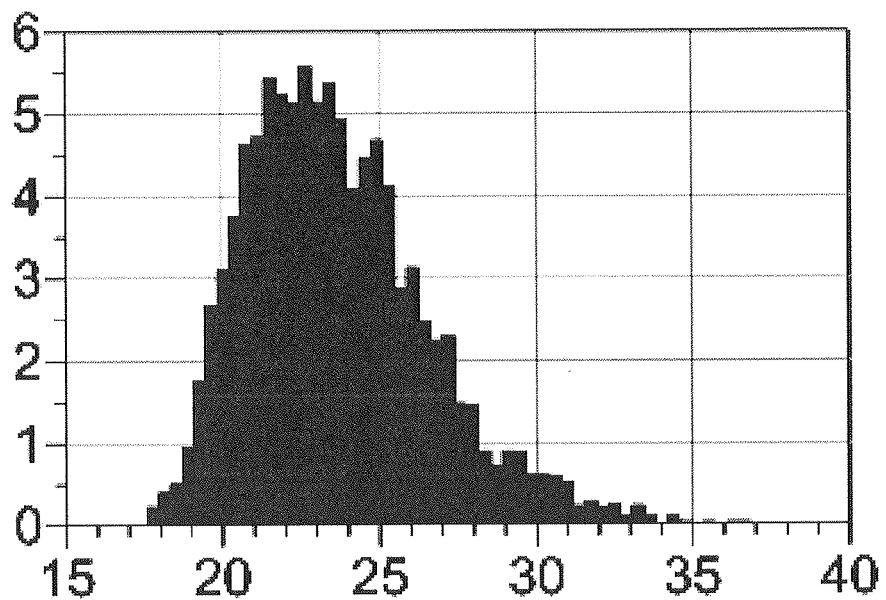
FIG. 3A shows a Monte Carlo histogram of the ratio $P_{refl\_transmitter}/P_{transmit}$ in percent for the CP1 mode and a frequency domain optimization.
Figure 3B:
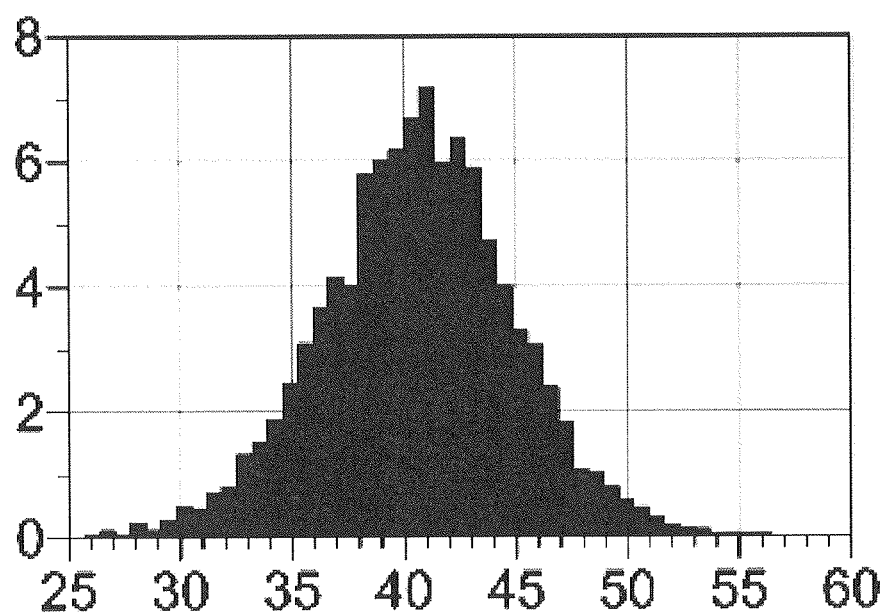
FIG. 3B shows a Monte Carlo histogram of the ratio $P_{refl\_transmitter}/P_{transmit}$ in percent for the CP2 mode and a frequency domain optimization.
Figure 3C:
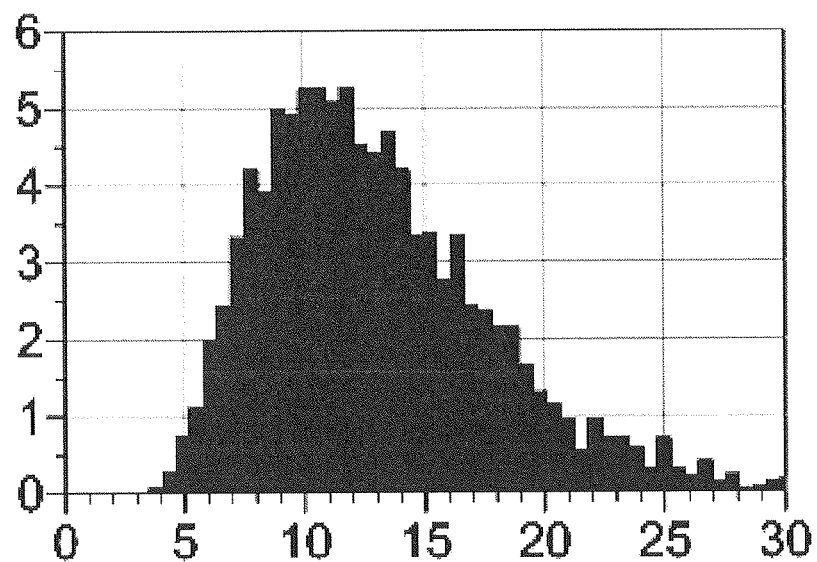
FIG. 3C shows a Monte Carlo histogram of the ratio $P_{refl\_transmitter}/P_{transmit}$ in percent for the CP1 mode and a dual domain optimization.
Figure 3D:
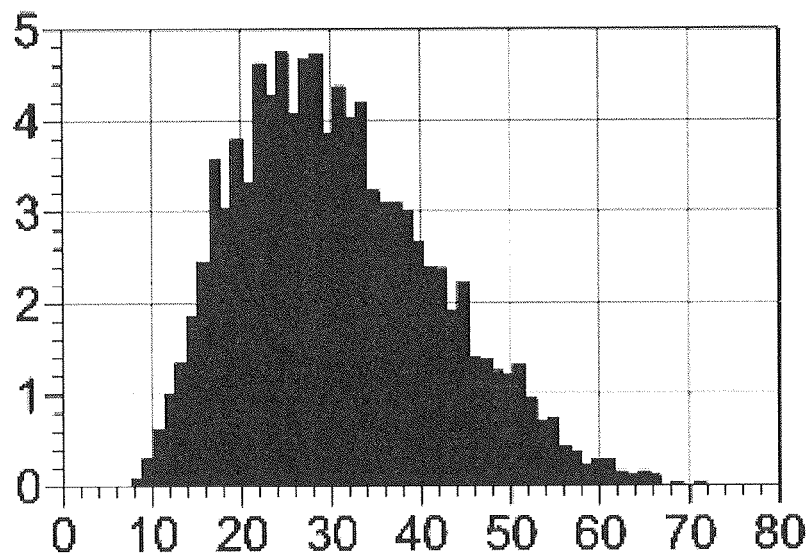
FIG. 3D shows a Monte Carlo histogram of the ratio $P_{refl\_transmitter}/P_{transmit}$ in percent for the CP2 mode and a dual domain optimization.

FIGS. 3A and 3C refer to the first circular polarization (CP1) mode, while FIGS. 3B and 3D refer to the second circular polarization (CP2) mode. Further, FIG. 3A and 3B illustrate a frequency domain optimization, while FIGS. 3C and 3D illustrate a dual domain optimization.

By Monte Carlo analysis, using 4000 trials with uniform +/−30% variation of phase for each excitation signal for CP1 and CP2 modes, the influence of dual-domain optimization on transmitter performance after static RF shimming was investigated. These results allow us to conclude that dual-domain optimization improves not only performance in fundamental CP1 and CP2 modes, but also the performance after static RF shimming has been performed for these fundamental modes (FIGS. 3A-3D).

Similar to single row transmitter, the dual-domain optimization of dual and triple row transmitters resulted in: a) significant reduction of $P_{refl\_transmitter}$ for all modes, provided that coupling to the second-neighbour elements in all direction was less than −9 dB after frequency domain optimization, b) S parameter matrix looked like a "badly" tuned transmitter, and c) improved performance after static RF shimming around given fundamental modes. However, the larger the number of transmitter elements, the larger is the worst case value of $P_{refl\_transmitter}$. For example, for a triple row transmitter, $P_{refl\_transmitter}$ could not be reduced to below 5% of $P_{transmit}$ in some excitation modes.

This novel optimization procedure has no practical effect on safety excitation efficiency, defined as $B_{1+\nu}/\sqrt{SAR_{10g}}$, or the peak location of the specific absorption rate averaged over 10 gram ($SAR_{10g}$). From the MRI perspective, it is the level of safe excitation efficiency that defines MRI scanner performance, not the peak $SAR_{10g}$, which increases when the new optimization procedure is used, simultaneously with an increase of $B_{1+\nu}$.

Although the invention has been described with reference to the particular arrangement of parts, features and the like, these are not intended to exhaust all possible arrangements of features, and indeed many other modifications and variations will be ascertainable to those of skill in the art.

The invention claimed is:

1. Method for optimization of a performance of a multi-channel transmitter comprising several transmit elements, wherein the method comprises:
   a) exciting the transmit elements of the multi-channel transmitter by electric excitation signals comprising a specific power, wherein the power of the excitation signals is partially reflected by the transmit elements of the multi-channel transmitter;
   b) determining a reflected power which is reflected by the multi-channel transmitter during excitation of the transmit elements;
   c) determining reflection coefficients $S_{xx}$ of the multi-channel transmitter, wherein said reflection coefficients $S_{xx}$ represent a signal ratio between an incident wave applied to the x-th transmit element of the multi-channel transmitter and a resulting wave reflected from the x-th transmit element of the multi-channel-transmitter;
   d) determining reflection coefficients $S_{xy}$ of the multi-channel transmitter, wherein said reflection coefficients $S_{xy}$ represent a signal ratio between an incident wave applied to the x-th transmit element of the multi-channel transmitter and a resulting wave reflected from the y-th transmit element of the multi-channel-transmitter;
   e) calculating a performance criterion representing the performance of the multi-channel transmitter, wherein the performance criterion is based on
      e1) the reflected power,
      e2) the reflection coefficients $S_{xx}$, and
      e3) the reflection coefficients $S_{xy}$; and
   f) tuning the multi-channel transmitter so that the performance criterion is optimized,
      wherein an optimization criterion is calculated according to the following formula and the multi-channel transmitter is tuned so that the optimization criterion is minimized:

$$EF = \sum_{\substack{all\ transmitter \\ elements}} w_{xx\_i} \times |S_{xx\_i} - S_{xx,Target}|^p +$$

$$\sum_{\substack{all\ decoupled \\ pairs\ of\ transmitter\ elements}} w_{xy\_i} \times |S_{xy\_i} - S_{xy,Target}|^p + w_{refl} \times |P_{Refl\_transmitter}|^p$$

with:
EF: Optimization criterion
$w_{xx\_i}$: Weighting factor for the reflection coefficient $S_{xx\_i}$ for the individual transmit element "i",
$w_{xy\_i}$: Weighting factor for the reflection coefficient $S_{xy\_i}$ for the "i" decoupled pair of transmit elements
$S_{xx,Target}$: Predetermined target value for each element reflection coefficient $S_{xx\_i}$
$S_{xy,Target}$: Predetermined target value for each reflection coefficient $S_{xy\_i}$
$w_{refl}$: Weighting factor for reflected power of the entire multi-channel transmitter
$P_{Refl\_transmitter}$: reflected power of the entire multi-channel transmitter
p: is a selected number.

2. Method according to claim 1, wherein the reflected power is measured for the entire multi-channel transmitter.

3. Method according to claim 1, wherein
   a) the excitation signals are radio frequency signals, and
   b) the excitation signals all have a fixed amplitude and a fixed phase.

4. Method according to claim 1, wherein
   a) the multi-channel transmitter is, after optimization, used at a certain operating frequency, and
   b) at least one of the reflection coefficients $S_{xx}$ and $S_{xy}$ and the reflected power are determined at the operating frequency of the multi-channel transmitter.

5. Method according to claim 1, wherein the reflection coefficients and the reflected power is numerically simulated so that the optimization criterion is numerically simulated without any transmitter measurements.

6. Method according to claim 1, wherein the multi-channel transmitter is a single-row transmitter comprising a single row of transmit elements.

7. Method according to claim 1, wherein the reflected power is measured for each of the transmitter elements separately.

8. Method according to claim 1, wherein the reflected power is measured for each row of multi-channel multi-row transmitter separately.

9. Method according to claim 1, wherein the reflection coefficients and the reflected power is measured so that the optimization criterion is calculated based on transmitter measurements.

10. Method according to claim 1, wherein the multi-channel transmitter is a multi-row transmitter including multiple rows of transmit elements.

11. Method according to claim 1, wherein the method is performed in a magnetic resonance imaging device.

12. Method according to claim 1, wherein the method is performed for at least one excitation mode and only one load of the multi-channel transmitter.

13. Method for optimization of a performance of a multi-channel transmitter comprising several transmit elements, wherein the method comprises:
   a) exciting the transmit elements of the multi-channel transmitter by electric excitation signals comprising a specific power, wherein the power of the excitation signals is partially reflected by the transmit elements of the multi-channel transmitter;

b) determining a reflected power which is reflected by the multi-channel transmitter during excitation of the transmit elements;

c) determining reflection coefficients $S_{xx}$ of the multi-channel transmitter, wherein said reflection coefficients $S_{xx}$ represent a signal ratio between an incident wave applied to the x-th transmit element of the multi-channel transmitter and a resulting wave reflected from the x-th transmit element of the multi-channel-transmitter;

d) determining reflection coefficients $S_{xy}$ of the multi-channel transmitter, wherein said reflection coefficients $S_{xy}$ represent a signal ratio between an incident wave applied to the x-th transmit element of the multi-channel transmitter and a resulting wave reflected from the y-th transmit element of the multi-channel-transmitter;

e) calculating a performance criterion representing the performance of the multi-channel transmitter, wherein the performance criterion is based on
   e1) the reflected power,
   e2) the reflection coefficients $S_{xx}$, and
   e3) the reflection coefficients $S_{xy}$; and f) tuning the multi-channel transmitter so that the performance criterion is optimized,
   wherein an optimization criterion is calculated according to the following formula and the multi-channel transmitter is tuned so that the optimization criterion is minimized:

$$EF = \sum_{\substack{all\ transmitter \\ elements}} w_{xx\_i} \times |S_{xx\_i} - S_{xx,Target}|^p + \sum_{\substack{all\ decoupled \\ pairs\ of\ transmitter\ elements}} w_{xy\_i} \times |S_{xy\_i} - S_{xy,Target}|^p + \sum_{all\ modes} w_{m\_i} \times |P_{Refl\_transitter\_i}|^p$$

with:
EF: Optimization criterion
$w_{xx\_i}$: Weighting factor for the reflection coefficient $S_{xx\_i}$ for the individual transmit element "i"
$w_{xy\_i}$: Weighting factor for the reflection coefficient $S_{xy\_i}$ for the "i" decoupled pair of transmit elements
$S_{xx,Target}$: Predetermined target value for each element reflection coefficient $S_{xx\_i}$
$S_{xy,Target}$: Predetermined target value for each reflection coefficient $S_{xy\_i}$
$w_{m\_i}$: Weighting factor for reflected power of the entire multi-channel transmitter for given transmit mode "i"
$P_{Refl\_transmitter\_i}$: reflected power of the entire multi-channel transmitter for given transmit mode "i"
p: is a selected number.

14. Method according to claim 13, wherein the method is performed for at least two excitation modes and only one load of the multi-channel transmitter.

15. Method for optimization of a performance of a multi-channel transmitter comprising several transit elements, wherein the method comprises:
   a) exciting the transmit elements of the multi-channel transmitter by electric excitation signals comprising a specific power, wherein the power of the excitation signals is partially reflected by the transmit elements of the multi-channel transmitter;
   b) determining a reflected power which is reflected by the multi-channel transmitter during excitation of the transmit elements;
   c) determining reflection coefficients $S_{xx}$ of the multi-channel transmitter, wherein said reflection coefficients $S_{xx}$ represent a signal ratio between an incident wave applied to the x-th transmit element of the multi-channel transmitter and a resulting wave reflected from the x-th transmit element of the multi-channel-transmitter;
   d) determining reflection coefficients $S_{xy}$ of the multi-channel transmitter, wherein said reflection coefficients $S_{xy}$ represent a signal ratio between an incident wave applied to the x-th transmit element of the multi-channel transmitter and a resulting wave reflected from the y-th transmit element of the multi-channel-transmitter;
   e) calculating a performance criterion representing the performance of the multi-channel transmitter, wherein the performance criterion is based on
      e1) the reflected power,
      e2) the reflection coefficients $S_{xx}$, and
      e3) the reflection coefficients $S_{xy}$; and
   f) tuning the multi-channel transmitter so that the performance criterion is optimized,
      wherein an optimization criterion is calculated according to the following formula and the multi-channel transmitter is tuned so that the optimization criterion is minimized:

$$EF = \sum_{all\ loads} \left[ \sum_{\substack{all\ transmitter \\ elements}} w_{xx\_i} \times |S_{xx\_i} - S_{xx,Target}|^p + \sum_{\substack{all\ decoupled \\ pairs\ of\ transmitter\ elements}} w_{xy\_i} \times |S_{xy\_i} - S_{xy,Target}|^p + \sum_{all\ modes} w_{m\_i} \times |P_{Re\ fl\_transmitter\_i}|^p \right]$$

with:
EF: Optimization criterion
$w_{xx\_i}$: Weighting factor for the reflection coefficient $S_{xx\_i}$ for the individual transmit element "i"
$w_{xy\_i}$: Weighting factor for the reflection coefficient $S_{xy\_i}$ for the "i" decoupled pair of transmit elements
$S_{xx,Target}$: Predetermined target value for each element reflection coefficient $S_{xx\_i}$
$S_{xy,Target}$: Predetermined target value for each reflection coefficient $S_{xy\_i}$
$w_{m\_i}$: Weighting factor for reflected power of the entire multi-channel transmitter for given transmit mode "i"
$P_{Refl\_transmitter\_i}$: reflected power of the entire multi-channel transmitter for given transmit mode "i"
p: is a selected number.

16. Method according to claim 15, wherein the method is performed for at least two excitation modes and at least two loads of the multi-channel transmitter.

17. Method for optimization of a performance of a multi-channel transmitter comprising several transit elements, wherein the method comprises:
   a) exciting the transmit elements of the multi-channel transmitter by electric excitation signals comprising a specific power, wherein the power of the excitation signals is partially reflected by the transmit elements of the multi-channel transmitter;

b) determining a reflected power which is reflected by the multi-channel transmitter during excitation of the transmit elements;

c) determining reflection coefficients $S_{xx}$ of the multi-channel transmitter, wherein said reflection coefficients $S_{xx}$ represent a signal ratio between an incident wave applied to the x-th transmit element of the multi-channel transmitter and a resulting wave reflected from the x-th transmit element of the multi-channel-transmitter;

d) determining reflection coefficients $S_{xy}$ of the multi-channel transmitter, wherein said reflection coefficients $S_{xy}$ represent a signal ratio between an incident wave applied to the x-th transmit element of the multi-channel transmitter and a resulting wave reflected from the y-th transmit element of the multi-channel-transmitter;

e) calculating a performance criterion representing the performance of the multi-channel transmitter, wherein the performance criterion is based on
   e1) the reflected power,
   e2) the reflection coefficients $S_{xx}$, and
   e3) the reflection coefficients $S_{xy}$; and f) tuning the multi-channel transmitter so that the performance criterion is optimized, wherein
   there is an interlaved excitation of the individual transmit elements of the multi-channel transmitter,
   an optimization criterion is calculated according to the following formula and
   the multi-channel transmitter is tuned so that the optimization criterion is minimized:

$$EF = \sum_{\substack{all\ transmitter \\ elements}} w_{xx\_i} \times |S_{xx\_i} - S_{xx,Target}|^p$$

$$\sum_{\substack{all\ decoupled \\ pairs\ of\ transmitter\ elements}} w_{xy\_i} \times |S_{xy\_i} - S_{xy,Target}|^p + w_{refl} \times$$

$$|P_{Refl\_transitter}|^p + \sum_{N_{is}} w_{t\_i} \times \left|P_{Refl\_transmitter\_is\_i} - \frac{P_{Transmit}}{N_{is}}\right|^p$$

with:
EF: Optimization criterion
$w_{xx\_i}$: Weighting factor for the reflection coefficient $S_{xx\_i}$ for the individual transmit element "i"
$w_{xy\_i}$: Weighting factor for the reflection coefficient $S_{xy\_i}$ for the "i" decoupled pair of transmit elements
$S_{xx,Target}$: Predetermined target value for each element reflection coefficient $S_{xx\_i}$
$S_{xy,Target}$: Predetermined target value for each reflection coefficient $S_{xy\_i}$
$w_{t\_i}$: Weighting factor for reflected power of the entire multi-channel transmitter for given transmit mode "i"
$P_{Refl\_transmitter\_i}$: Reflected power of the multi-channel transmitter for given interleave stage "i"
$P_{Transmit}$: Power transmitted by the multi-channel transmitter
$N_{is}$: Number of interleave stages
p: is a selected number.

18. Method according to claim 17, wherein the method is performed for at least one excitation mode and at least one load of the multi-channel transmitter.

* * * * *